(12) United States Patent
Heigl

(10) Patent No.: US 12,550,326 B2
(45) Date of Patent: Feb. 10, 2026

(54) METHOD FOR PRODUCING A THREE-DIMENSIONALLY INTEGRATED SEMICONDUCTOR MEMORY

(71) Applicant: Fraunhofer-Gesellschaft zur Förderung der angewandten Forschung e.V., Munich (DE)

(72) Inventor: Martin Heigl, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 662 days.

(21) Appl. No.: 17/933,508

(22) Filed: Sep. 20, 2022

(65) Prior Publication Data

US 2023/0087266 A1 Mar. 23, 2023

(30) Foreign Application Priority Data

Sep. 20, 2021 (EP) ..................................... 21197603

(51) Int. Cl.
*H10B 41/27* (2023.01)
*H10B 43/27* (2023.01)

(52) U.S. Cl.
CPC ............. *H10B 43/27* (2023.02); *H10B 41/27* (2023.02)

(58) Field of Classification Search
CPC ...... H01L 21/3065; H10B 41/27; H10B 43/27
See application file for complete search history.

(56) References Cited

U.S. PATENT DOCUMENTS 5,155,657 A * 10/1992 Oehrlein ............. H10B 12/318
361/313
8,445,347 B2 * 5/2013 Alsmeier ............. H01L 21/764
257/E21.422
(Continued)

FOREIGN PATENT DOCUMENTS

DE 10 2009 042 321 A1 3/2011
KR 10-2021-0024641 A 3/2021
WO 2019/108366 A1 6/2019

OTHER PUBLICATIONS

Lehmann, V., et al.; "Porous silicon formation: A quantum wire effect;" Appl. Phys. Lett. 58, 856 1991; Mar. 1990; pp. 855-858.
(Continued)

*Primary Examiner* — Jaehwan Oh
(74) *Attorney, Agent, or Firm* — McClure, Qualey & Rodack, LLP

(57) ABSTRACT

The concept relates to a method for producing a three-dimensionally integrated semiconductor memory. A layer stack having several individual layers of different material types is provided and individual layers of a first material type are etched out selectively from the layer stack by a dry etching process. Individual layers of a third material type are generated either by filling voids with a third material or converting the individual layers of the second material type into the individual layers of the third material type, or by coating the individual layers of the second material type with a material of the third material type. Voids between the individual layers of the third material type can then again be filled with a fourth material, such that individual layers of a fourth material type are formed in these voids.

10 Claims, 12 Drawing Sheets

(56) References Cited

U.S. PATENT DOCUMENTS

| | | | |
|---|---|---|---|
| 9,362,302 B1* | 6/2016 | Lai | H10B 43/27 |
| 9,484,353 B1* | 11/2016 | Lai | H10B 41/27 |
| 10,332,835 B2* | 6/2019 | Lai | H10B 43/27 |
| 10,510,415 B1 | 12/2019 | Huo et al. | |
| 10,608,013 B1* | 3/2020 | Xiao | G11C 16/0483 |
| 11,271,007 B2* | 3/2022 | Xia | H10B 41/10 |
| 11,862,565 B2* | 1/2024 | Sun | H10B 43/10 |
| 12,302,561 B2* | 5/2025 | Kang | H10B 41/10 |
| 2012/0256247 A1* | 10/2012 | Alsmeier | H10D 30/689 |
| | | | 257/E21.422 |
| 2014/0306279 A1* | 10/2014 | Park | H10B 41/27 |
| | | | 257/314 |
| 2017/0025428 A1* | 1/2017 | Lai | H10D 64/037 |
| 2017/0287930 A1* | 10/2017 | Lee | H01L 23/535 |
| 2017/0358590 A1* | 12/2017 | Kang | H10B 43/35 |
| 2020/0098781 A1* | 3/2020 | Xiao | H10B 43/10 |
| 2021/0066337 A1 | 3/2021 | Xia et al. | |
| 2022/0093641 A1* | 3/2022 | Wang | H10D 64/037 |
| 2023/0087266 A1* | 3/2023 | Heigl | H10B 43/27 |
| | | | 438/269 |

OTHER PUBLICATIONS

Lehmann, V.; "The Physics of Macropore Formation in Low Doped n-Type Silicon;" J. Electrochem. Soc.; vol. 140; No. 10; Oct. 1993; pp. 2836-2843.

Wehrspohn, R.B., et al.; "Spatial versus quantum confinement in porous amorphous silicon nanostructures;" European Physical Journal B 8; 1999; pp. 179-193.

Korean language office action dated Feb. 1, 2024, issued in application No. KR 10-2022-0118807.

English language translation of office action dated Feb. 1, 2024 (pp. 1-6 of attachment).

Entergris; "Cosiderations for Improving 3D NAND Performance, Reliability, and Yield, White paper;" pp. 1-7.

System Puls Consulting; Samsung V NAND Gen 4 KLUCG2K1EA; 2018; pp. 157-164.

* cited by examiner

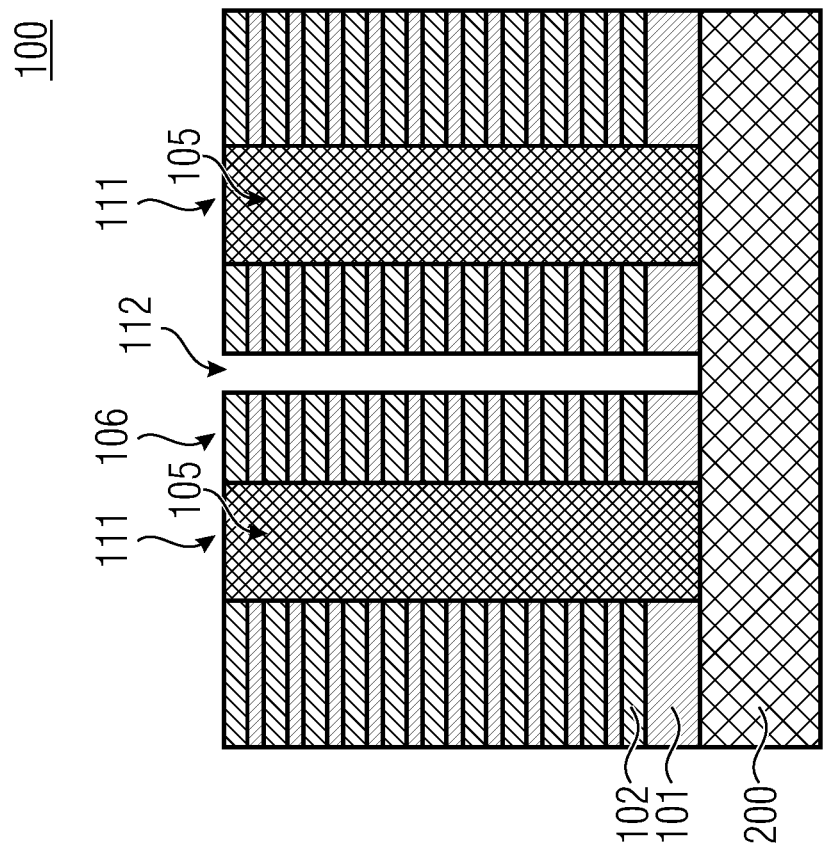
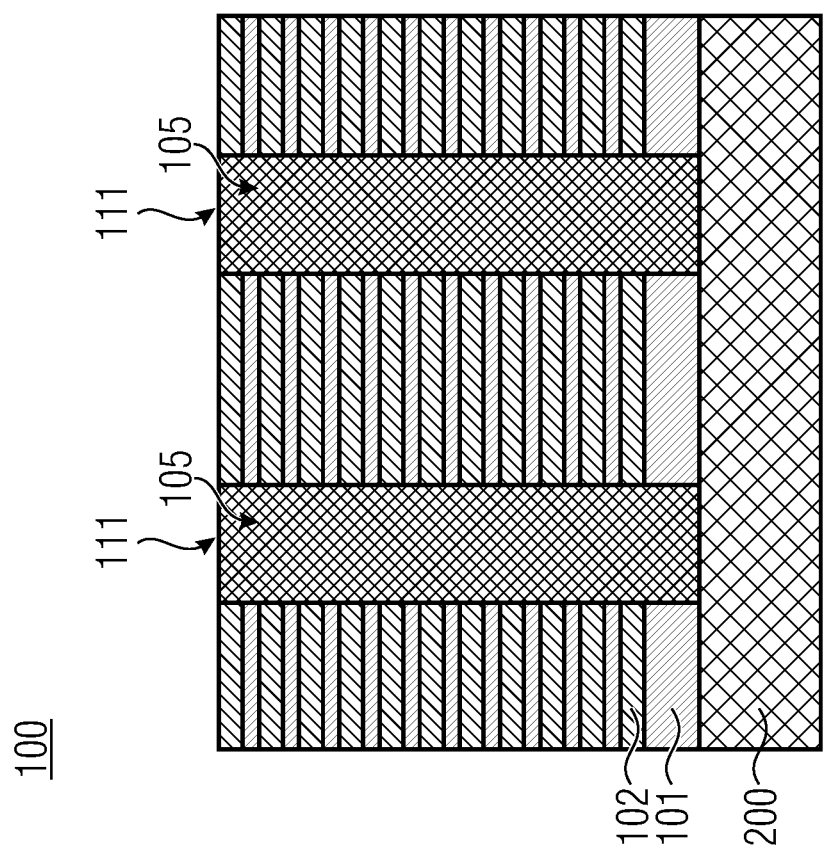
Fig. 2D
Fig. 2C

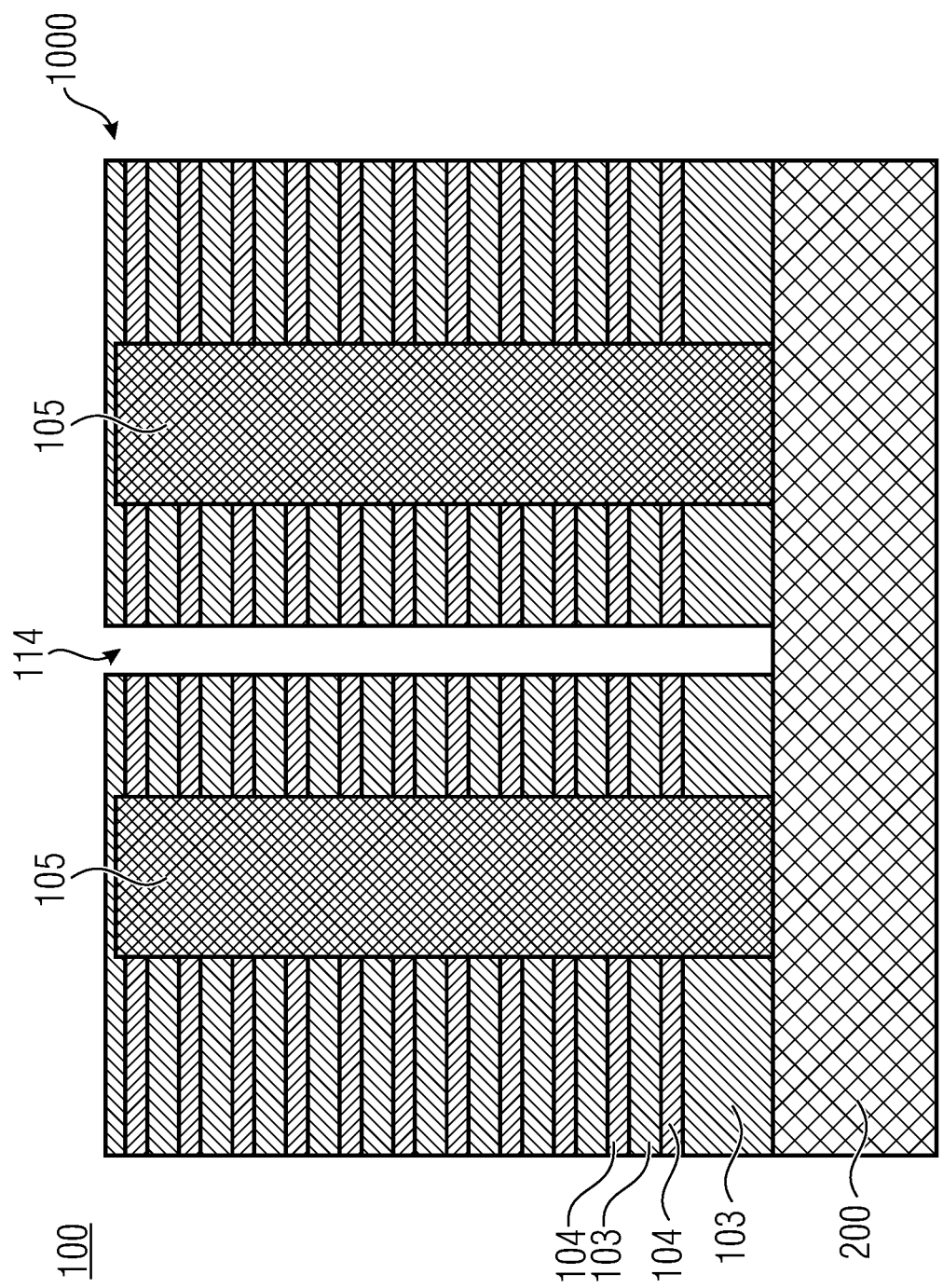

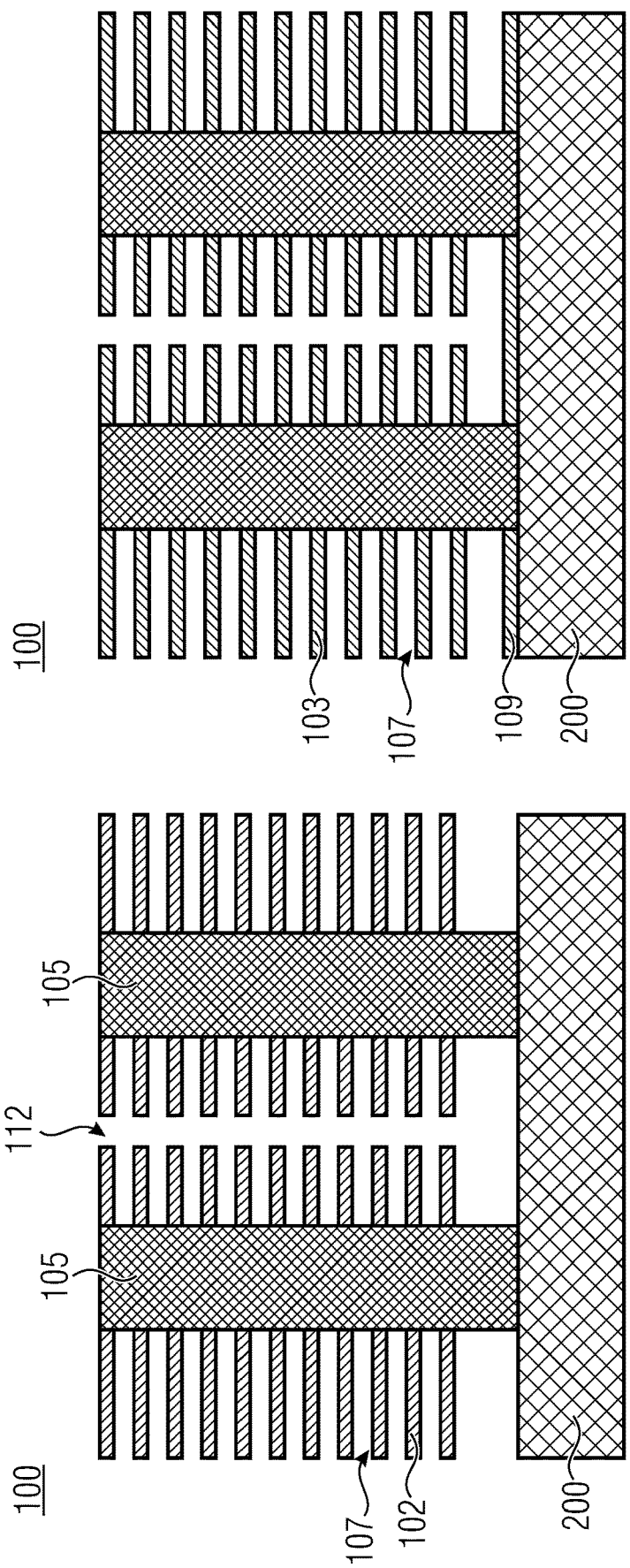

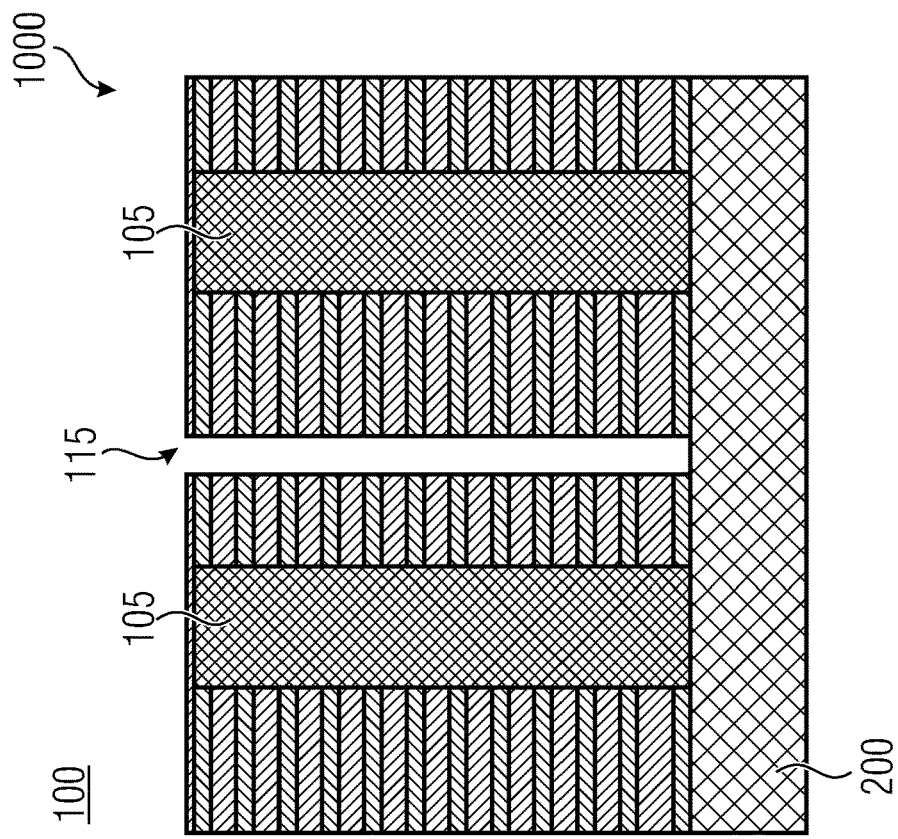
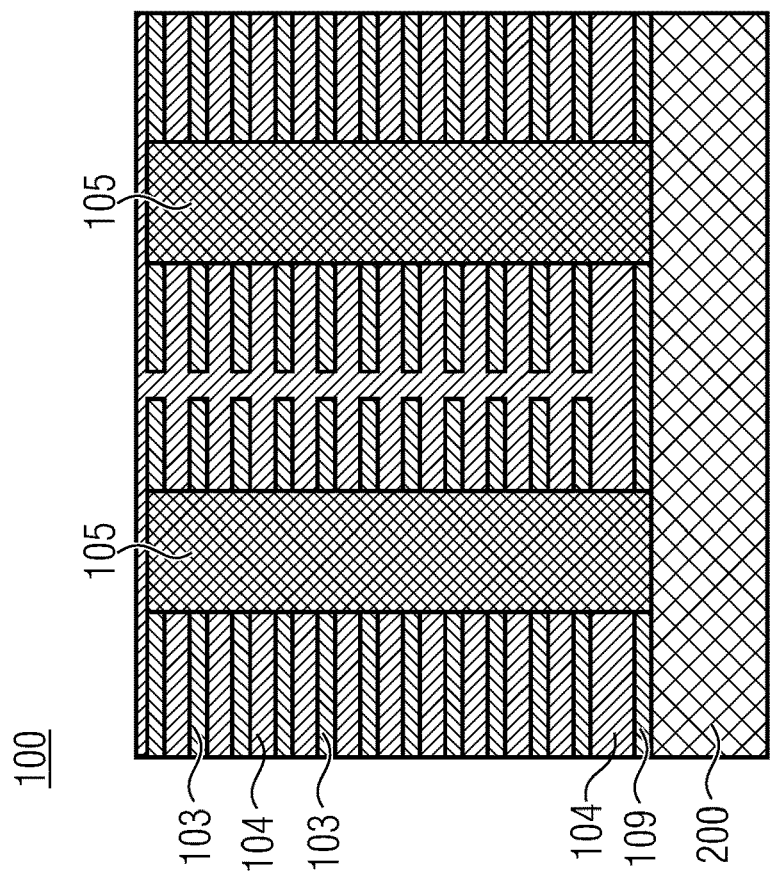
Fig. 3D
Fig. 3C

METHOD FOR PRODUCING A THREE-DIMENSIONALLY INTEGRATED SEMICONDUCTOR MEMORY

CROSS-REFERENCE TO RELATED APPLICATIONS

This application claims priority from European Patent Application No. 21197603.0, which was filed on Sep. 20, 2021, and is incorporated herein in its entirety by reference.

The innovative concept described herein relates to the technical field of producing three-dimensionally integrated semiconductor memories, such as three-dimensional NAND flash memories. Compared to conventional planar technology (x-y direction), in three-dimensional integration, devices are additionally generated in a vertical direction (z-direction). The innovative concept described herein provides novel methods for producing such three-dimensionally integrated semiconductor memories by using dry etching processes.

BACKGROUND OF THE INVENTION

So-called flash memory elements are realized, for example, with NAND cells. To obtain a high memory capacity of flash memories, the needed NAND cells are arranged vertically on top of each other, which is also referred to as three-dimensional system integration. Such a three-dimensional memory device with several memory cells arranged vertically on top of each other is also referred to as 3D NAND.

In previous production methods for producing 3D NAND memories, many individual layers of $Si_3N_4$—$SiO_2$ (silicon nitride-silicone(di)oxid) are stacked on top of each other, such that a vertical layer stack results. By means of vertically etched holes within the layer stack, the individual layers of the layer stack are then laterally exposed. Subsequently, the $Si_3N_4$ layers are etched selectively to $SiO_2$. The resulting voids in the form of free, i.e., unfilled columns are then filled with tungsten, which later forms the word line of the memory.

Selectively etching $Si_3N_4$ selectively to $SiO_2$ is previously performed by means of a wet chemical method using hot phosphoric acid (at approximately 160° C.) that flows into the vertical hole in the layer stack and reaches the individual layers exposed and made accessible within the hole in order to etch the same out of the layer stack in lateral direction.

For increasing the memory capacity of the vertical layer stack or the 3D NAND memory, the number of individual layer stack on top of each other has to be increased.

Obviously, this means the vertical holes have to be made deeper and deeper, i.e., the aspect ratio (depth to width) of the vertical holes has to be increased. By increasing the aspect ratio of these holes (currently, e.g., 50:1), it becomes increasingly difficult to obtain a homogenous etching rate of $Si_3N_4$ selectively to $SiO_2$ along the vertical hole by the wet chemical etching solution. This means with increasing depth of the hole, the layers located at the bottom end of the hole are etched away significantly less than the layers located at the top of the hole input, with the same etching duration.

The resulting problem is a limitation of the number of individual layers within the layer stack and the associated limitation of the memory capacity. This means the vertical holes cannot be implemented in any depth, as otherwise increasingly distinct inhomogeneous etching rates result. Nowadays, up to approximately 96 individual layers can be laterally etched away with this technology. Thus, the number of individual layers within a layer stack is limited to those approximately 96 individual layers. However, this also means that the layer stack may not comprise a lot more individual layers, which accordingly limits the memory capacity of the layer stack.

SUMMARY

According to an embodiment, a method for producing a three-dimensionally integrated semiconductor memory may have the steps of: providing a substrate, generating a layer stack including several individual layers on the substrate, by alternately depositing several individual layers of a first material type as well as several individual layers of a different second material type, structuring at least one first vertical recess in the layer stack and generating a support structure within the first vertical recess, wherein the support structure is connected to the respective individual layers and mechanically stabilizes the same, structuring at least one second vertical recess in the layer stack, wherein the second vertical recess provides access to the respective individual layers of the layer stack, selectively removing the individual layers of the first material type that have been made accessible by applying an etching process directed in lateral direction by means of an etching gas reaching into the layer stack through the second vertical recess and reaching the individual layers of the first material type that have been made accessible therein and removing the same in lateral direction selectively to the individual layers of the second material type, such that after selectively removing the individual layers of the first material type the individual layers of the second material type remain in the layer stack and voids are formed between the remaining individual layers of the second material type, generating individual layers of a third material type at the locations in the layer stack where the individual layers of the second material type were located before, by maintaining the voids that are thus located between the individual layers of the generated third material type, wherein the individual layers of the first material type include silicon germanium or consist of silicon germanium and the etching process for selectively removing the individual layers of the first material type directed in lateral direction is performed in the form of a dry etching process by using an etching gas.

According to another embodiment, a method for producing a three-dimensionally integrated semiconductor memory may have the steps of: providing a substrate, generating a layer stack including several individual layers on the substrate by alternately depositing several individual layers of a first material type as well as several individual layers of a different second material type, structuring at least one first vertical recess in the layer stack and generating a support structure within the first vertical recess, wherein the support structure is connected to the respective individual layers and mechanically stabilizes the same, structuring at least one second vertical recess in the layer stack, wherein the second vertical recess provides access to the respective individual layers of the layer stack, selectively removing the individual layers of the first material type that have been made accessible by applying an etching process directed in lateral direction by means of an etching gas reaching into the layer stack through the second vertical recess and reaching the individual layers of the first material type that have been made accessible therein and removing the same in lateral direction selectively to the individual layers of the second material type, such that after selectively removing the individual layers of the first material type the individual layers of the second material type remain in the layer stack and voids are formed between the remaining individual layers of the second material type, generating individual layers of a third material type by means of introducing a third material into the voids formed in that way, such that individual layers of a third material type are each formed within the voids between the remaining individual layers of the second material type, structuring at least a third vertical recess in the layer stack, wherein the third vertical recess provides access to the respective individual layers of the layer stack, selectively removing the individual layers of the second material type that have been made accessible by applying an etching process directed in lateral direction by means of an etching medium reaching into the layer stack through the third vertical recess and reaching the individual layers of the second material type made accessible therein and selectively removing the same in lateral direction, such that after selectively removing the individual layers of the third material type remain and voids are formed between these remaining individual layers of the third material type, wherein the individual layers of the first material type include silicon germanium or consist of silicon germanium and the etching process directed in lateral direction for selectively removing the individual layers of the first material type is performed in the form of a dry etching process by using an etching gas.

Another embodiment may have a three-dimensionally integrated semiconductor memory that can be produced by any of the inventive methods.

Both inventive methods serve to produce such an improved three-dimensionally integrated semiconductor memory. The inventive method according to a first embodiment having the features of claim 6 includes, among others, providing a substrate. On the substrate, a layer stack comprising several individual layers is generated by arranging alternately several individual layers of a first material type (e.g., a compound semiconductor, such as SiGe) as well as several individual layers of a different second material type (e.g., an elemental semiconductor, such as Si). The respective individual layers are stacked vertically on top of each other in an alternating manner, such that a layer stack extending vertically towards the top from the substrate results. At least one first vertical recess is structured in this layer stack. This first vertical recess extends from top to bottom, i.e., starting from a side of the layer stack facing away from the substrate vertically towards the bottom in the direction of the substrate. Here, the first vertical recess extends through at least one of the individual layers, advantageously through several individual layers and more advantageously through all individual layers of the layer stack down to the substrate. A support structure is generated within this first vertical recess. This support structure is connected to the respective individual layers to stabilize or support the same mechanically during the further process steps. Further, the method includes a step of structuring at least a second vertical recess in the layer stack. This second vertical recess also extends from top to bottom, i.e., starting from a side of the layer stack facing away from the substrate vertically towards the bottom in the direction of the substrate. The second vertical recess additionally extends through at least one of the individual layers, advantageously through several individual layers and even more advantageously through all individual layers of the layer stack down to the substrate. The second vertical recess forms an access to the respective individual layers of the layer stack, in this case to the individual layers of the first and second material type existing in the layer stack at this time. By means of the second vertical recess, the respective individual layers of the first and second material types are exposed and made laterally accessible within and along the second vertical recess. For example, an etching gas can flow into the layer stack through the second vertical recess and can reach the individual layers of the first and second material type, which have been made accessible therein. The method includes a step of selectively removing individual layers of the first material type that have been made accessible by applying an etching process directed in a lateral direction by means of an etching medium, e.g., by means of an etching gas. The etching gas reaches into the layer stack through the second vertical recess where the same reaches the individual layers of the first and second material type that are exposed in portions. The etching gas removes individual layers of the first material type selectively to the individual layers of the second material type in a lateral direction. A lateral direction means a direction running essentially orthogonally to the (vertical) layer direction of the layer stack. Therefore, the etching gas removes the individual layers of the first material type in the lateral direction from the first vertical opening laterally (e.g., horizontally) to the outside. This means the individual layers of the first material types are etched out of the layer stack selectively to the individual layers of the second material type. After this selective removal of the individual layers of the first material type, merely the individual layers of the second material types remain in the layer stack. These remaining individual layers of the second material types are still supported on the support structure. Accordingly, voids are formed between the remaining individual layers of the second material type at the locations where the individual layers of the first material types were, which have been removed in the meantime. Further, the inventive method according to this first embodiment includes generating individual layers of a third material type, by introducing a third material into the resulting voids, such that individual layers of a third material type are formed within these voids between the remaining individual layers of the second material type. The third material type differs from the second material type. Further, the method includes a step of structuring at least one third vertical recess in the layer stack. This third vertical recess extends also from top to bottom, i.e., from a side of the layer stack facing away from the substrate vertically to the bottom in the direction of the substrate. Additionally, the third vertical recess extends through at least one of the individual layers, advantageously through several individual layers and more advantageously through all individual layers of the layer stack down to the substrate. The third vertical recess forms an access to the respective individual layers of the layer stack, in this case, to the individual layers of the second and third material type existing in the layer stack at this time. The method includes selectively removing the individual layers of the second material type that have been made accessible, selectively to the individual layers of the third material type. This selective removal takes place by applying an etching process by means of an etching medium directed in lateral direction. The etching medium can be an etching gas (also an ionized etching gas or plasma like in plasma etching) or a wet chemical etching solution. The etching medium reaches into the layer stack through the third vertical recess and to the individual layers of the second and third material type that have been made accessible within the third vertical recess. The etching medium removes the individual layers of the second material type in lateral direction selectively to the individual layers of the third material type, such that after selectively removing the second material type, the individual layers of the third material type remain. Thus, voids are formed between the remaining individual layers of the third material type at the locations where the individual layers of the second material were, which have been removed in the meantime. The inventive method is characterized, among others, by the fact that the individual layers of the first material type comprise silicon germanium or consist of silicon germanium. Additionally, the etching process performed in a lateral direction is performed for selectively removing the individual layers of the first material type in the form of a dry etching process by using an etching gas. By using such a layer stack, dry etching processes can be used for the generation of lateral gaps (voids), which have no wetting problems compared to convention wet chemical etching processes or methods and can also be significantly optimized with respect to the diffusion transport. Compared to the wet chemical methods, the dry etching process has significantly more degrees of freedom in process optimization, such as a greater temperature window, a variable process pressure or also different process gas flows. With these options, the selective etchings with respect to the etching rate homogeneity along a vertical hole in the layer stack can be optimized despite constantly increasing aspect ratios.

The inventive method according to a second embodiment, with the features of claim 1, provides an alternative to the first embodiment (claim 6). However, in the end, both methods serve to produce a three-dimensionally integrated semiconductor memory. This means both inventive methods solve the same objective technical object, but with alternative method steps. For example, the method according to the alternative second embodiment (claim 1) differs from the above-discussed embodiment (claim 6), among others, regarding the type of generating the individual layers of the third material type. According to the alternative second embodiment (claim 1), the individual layers of the third material type are generated by maintaining the voids existing between the individual layers of the second material type, such that the generated individual layers of the third material type are now located at those locations in the layer stack where the individual layers of the second material type were located before. This saves several process steps described in the first embodiment (claim 6), such as filling the voids with the third material to generate the individual layers of the third material type as well as the subsequent removal of the individual layers of the second material type.

According to this alternative second embodiment (claim 1), the individual layers of the third material type can be generated, for example, by an at least partial (thermal) oxidation of the individual layers of the second material type. This means the individual layers of the second material type (e.g., elemental semiconductor Si) can be converted to an oxide by thermal oxidation, i.e., by reaction with oxygen, which changes the characteristics, i.e., the material type of these individual layers changes. For example, the individual layers of the second material type comprise first an electrically semiconductive material type (e.g., elemental semiconductor Si). By the conversion into an oxide, these individual layers could become electrically insulating, i.e., the material type changes from originally electrically semiconductive to electrically insulating (e.g., insulator $SiO_2$). This means, the individual layers of the third material type (e.g., insulator $SiO_2$) can be generated from the individual layers of the second material type (e.g., semiconductor Si) by means of thermal oxidation. It would also be possible that the individual layers of the second material type (e.g., elemental semiconductor Si) are alternatively or additionally coated with a coating material, for example, by applying a deposition method. The deposition material can have, for example, electrically insulating characteristics, and can comprise, for example, an oxide or a nitride, or can consist of an oxide or a nitride. Thus, the individual layers of the third material type would be generated in that the individual layers of the second material type are coated with a coating material. Here, the coating material can have other characteristics, i.e., a different material type than the individual layers of the second material type.

BRIEF DESCRIPTION OF THE DRAWINGS

Embodiments of the present invention will be detailed subsequently referring to the appended drawings, in which:

FIGS. 2A-2H show schematic sectional side views for illustrating individual method steps for producing an inventive 3D semiconductor memory by means of a method according to a first embodiment of the present invention, FIGS. 2J-2K show further schematic side sectional views for illustrating individual method steps for producing the inventive 3D semiconductor memory of FIGS. 2A-2H, and FIGS. 3A-3D show schematic sectional side views for illustrating individual method steps for producing an inventive 3D semiconductor memory by means of a method according to a second alternative embodiment of the present invention.

DETAILED DESCRIPTION OF THE INVENTION

Figure 1B:
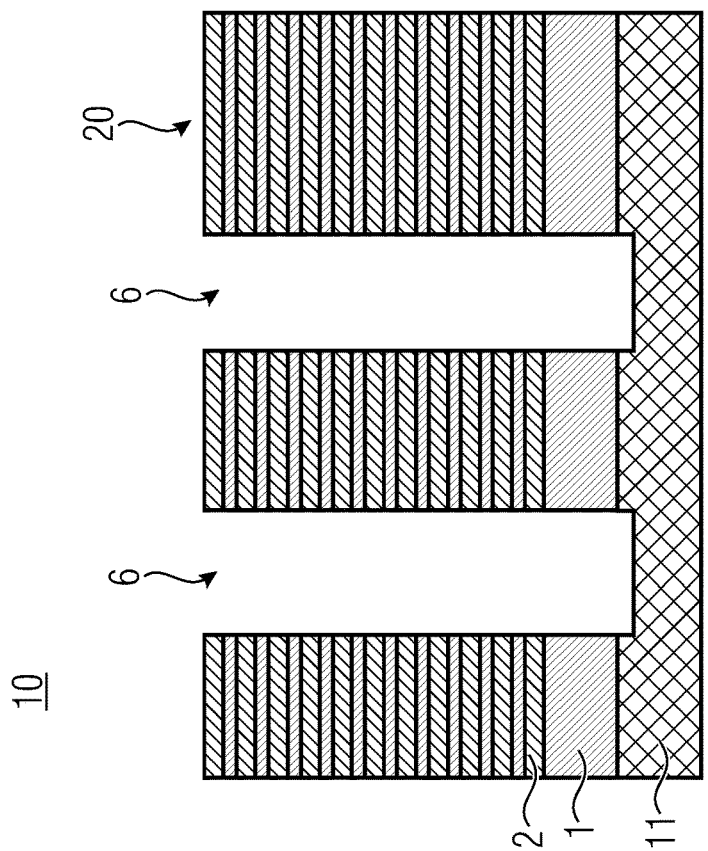
FIGS. 1A-1E show schematic sectional side views for illustrating individual method steps for producing a conventional 3D semiconductor memory with conventional methods according to conventional technology.

In the following, embodiments will be described in more detail with reference to the figures, wherein elements having the same or similar function are provided with the same reference numbers.

Method steps imaged or described within the present disclosure can also be implemented in a different manner than the shown or described order. Additionally, method steps relating to a specific feature of an apparatus can be exchanged with the same feature of the apparatus, which also applies vice versa.

When a vertical direction is mentioned within this disclosure, this is the direction that is perpendicular to the plane spanned by an individual layer. If, for example, an individual layer extends in the x-y plane with respect to its length and width, the vertical direction would correspond to its z-axis. In this case, for example, the thickness of the individual layer would also be measured in the z-direction. Within the layer stack, the respective individual layers are stacked on top of each other in exactly this vertical direction (z-axis), such that the layer stack extends vertically towards the top starting from the substrate.

When a lateral direction is mentioned within this disclosure, this is the direction running within or parallel to an (x-y) plane spanned by an individual layer or runs perpendicular to the vertical extension direction (z-axis) of the layer stack. In the case of a vertically extending layer stack, the lateral direction can therefore be essentially identical to a horizontal direction.

When individual layers of different material types are mentioned in this disclosure, this means, first, that the different material types have different physical and/or chemical and/or electrical characteristics. For example, a distinction can be made between electrically insulating material types and electrically conductive material types. The electrically conductive material types can further be differentiated into conductors and semiconductors. The semiconductors can again be differentiated in elemental semiconductors such as, e.g. (doped) silicon and into compound semiconductors, such as II-VI, III-III or IV-IV (e.g. SiGe) semiconductors. Different material types can also have, for example, a different etching behavior. For example, two different material types can have a high etching selectivity relative to each other. For example, a first material type can react very well with a specific etching medium while a second material type reacts hardly or not at all with the same etching medium, such that the first material type is structured by means of the etching medium while the second material type remains almost unamended. Individual layers of different material types can comprise different materials or material combinations or can consist of different materials or material combinations.

Before the inventive method will be described, conventional technology will be discussed briefly. FIGS. 1A-1E show a method for producing a three-dimensionally integrated semiconductor memory 10 according to conventional technology.

Figure 1A:
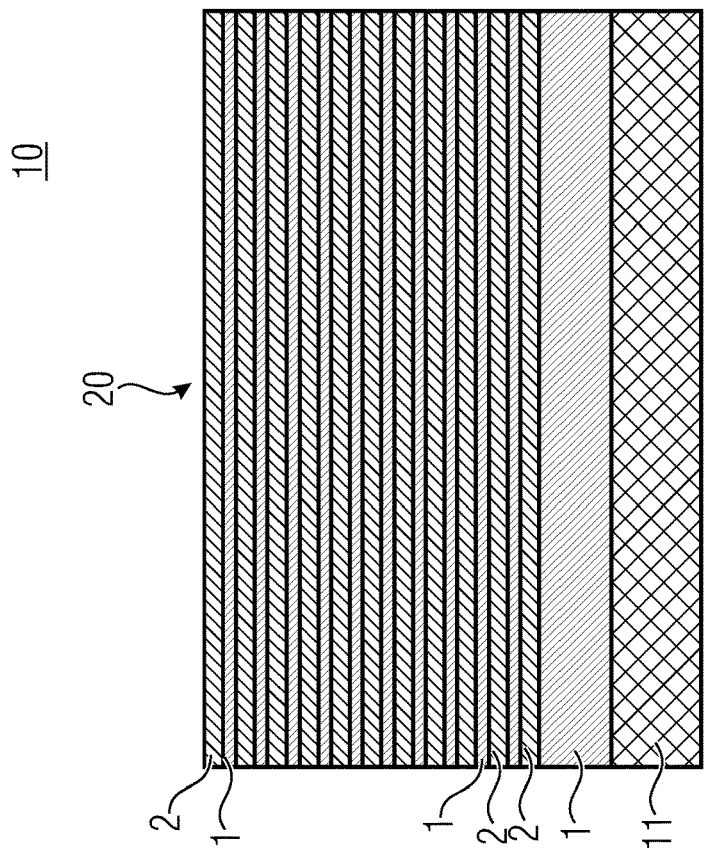
Figure 1D:
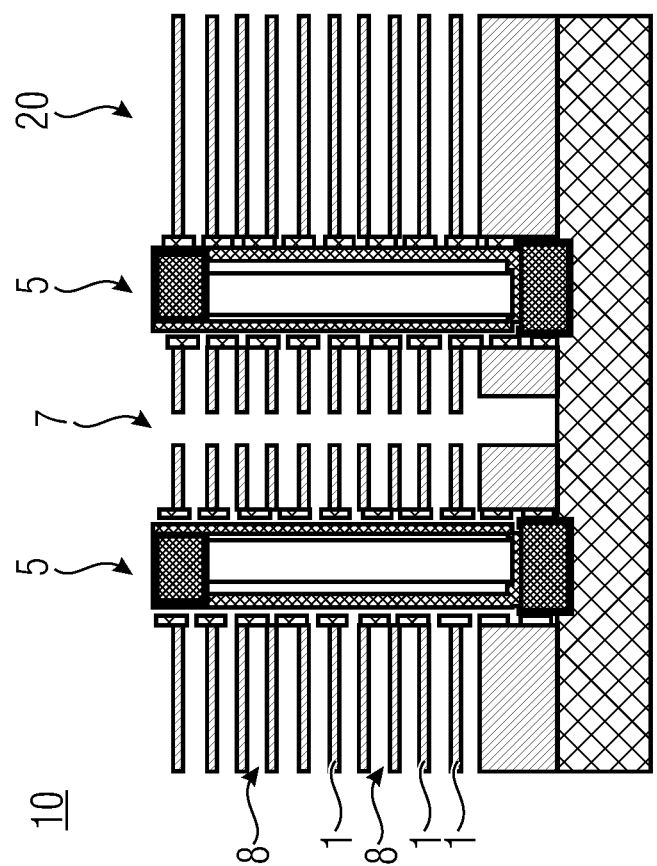

As can be seen in FIG. 1A, first, several individual layers 1, 2 are arranged alternately on top of each other on a silicon substrate 11. These are individual layers 1 of silicon oxide ($SiO_2$) as well as individual layers 2 of silicon nitride ($Si_3N_4$). These individual layers 1, 2 arranged alternately on top of each other form a vertical layer stack 20.

FIG. 1B shows a next process step, wherein one or several vertical recesses 6 are structured into the vertical layer stack 20.

Figure 1C:
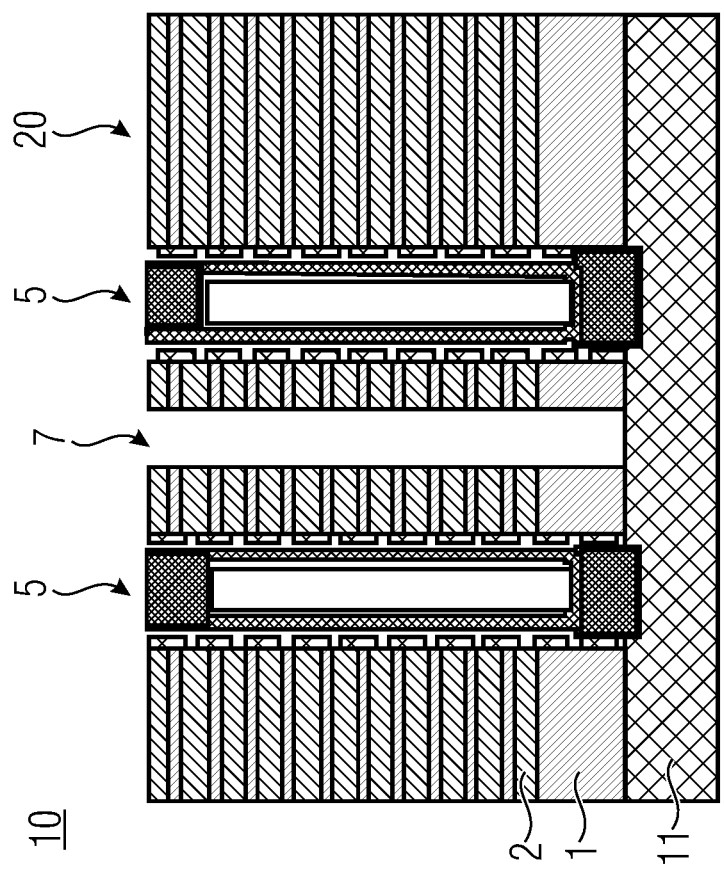

In FIG. 1C, it can be seen that support structures 5 are generated in the vertical recess 6. The support structures 5 are mechanically connected to the individual layers 1, 2 and stabilize the individual layers 1, 2. A second vertical recess 7 is structured in the layer stack 20 between the two support structures 5. By this second vertical recess 7, the individual layers 1, 2 are laterally exposed, such that the individual layers 1, 2 are freely accessible within the second vertical recess 7.

During a wet chemical etching process (FIG. 1D), hot phosphoric acid can enter the layer stack 20 through the second vertical recess 7. Thereby, the hot phosphoric acid reaches the exposed individual layers 1, 2 and etches out selectively the silicon nitride individual layers 2, such that only the silicon oxide individual layers 1 remain. Voids 8 are formed between the silicon oxide individual layers 1 where the silicon nitride individual layers 2 were located before.

Figure 1E:
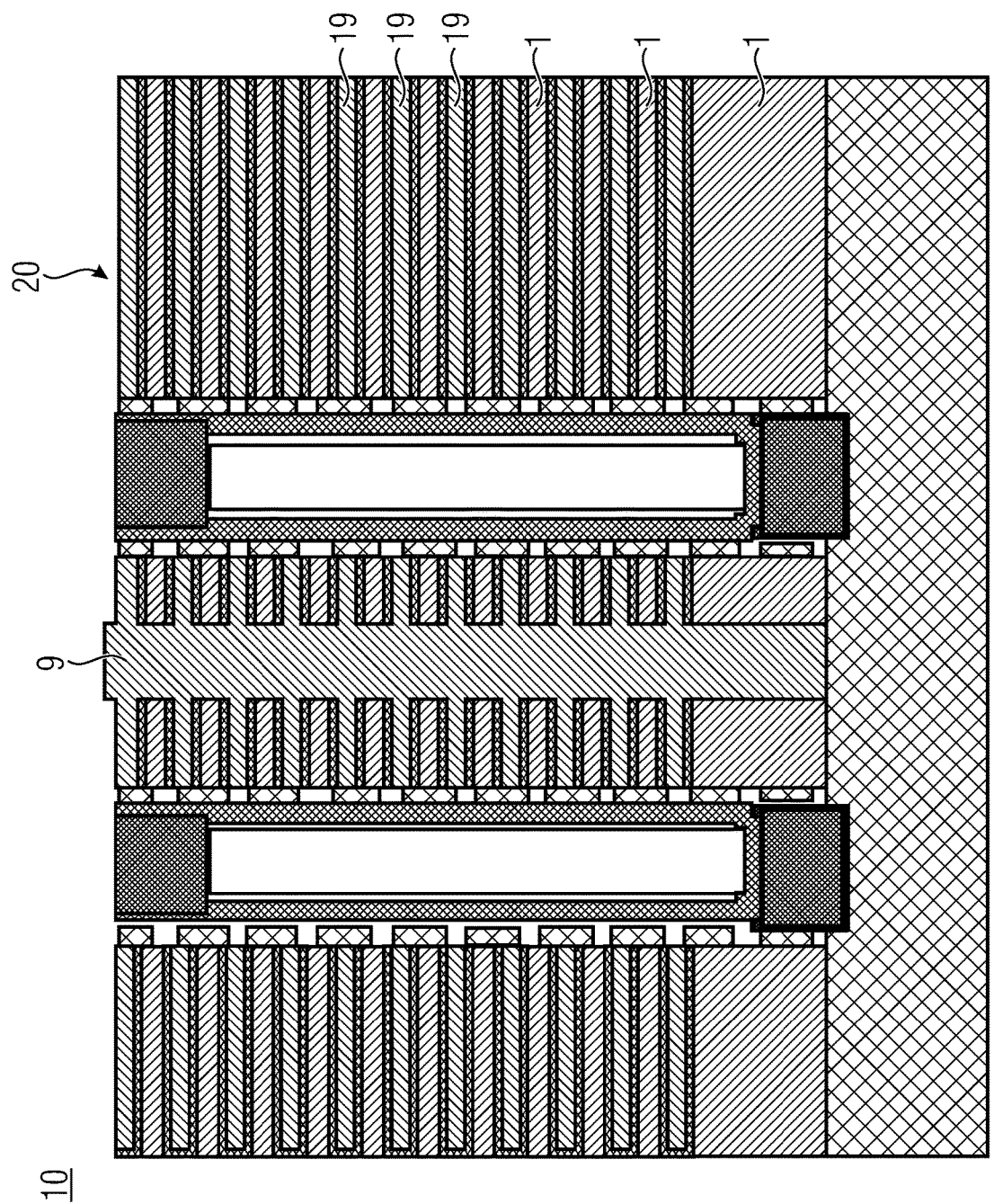

As can be seen in FIG. 1E, these voids 8 are then filled with tungsten 9. As a result, a vertical layer stack 20 results that comprises silicon oxide individual layers 1 arranged alternately on top of each other as well as tungsten individual layers 19.

As has already been mentioned above, it is an intention in the production of 3D NAND memory cells to increase their memory capacity per volume. This is obtained, among others, by alternately stacking more and more individual layers of silicon nitride ($Si_3N_4$) and silicon oxide ($SiO_2$) on top of each other, whereby, obviously, the height of the vertical layer stack 20 as a whole increases. In order to be able to etch laterally all silicon nitride individual layers 2, the second vertical recess 7 is introduced into the layer stack 20, as mentioned above. Through the second vertical recess 7, hot phosphoric acid reaches the silicon nitride individual layers 10 each exposed and made accessible within the second vertical recess 7. However, with increasing height of the layer stack 20, the aspect ratio of the second vertical recess 7 has to be increased accordingly. With increasing aspect ratio (currently, e.g. 50:1) it becomes increasingly difficult to obtain a homogenous etching rate of $Si_3N_4$ selectively to $SiO_2$ along the second vertical recess 7 with the wet chemical etching solution.

Figure 1F:
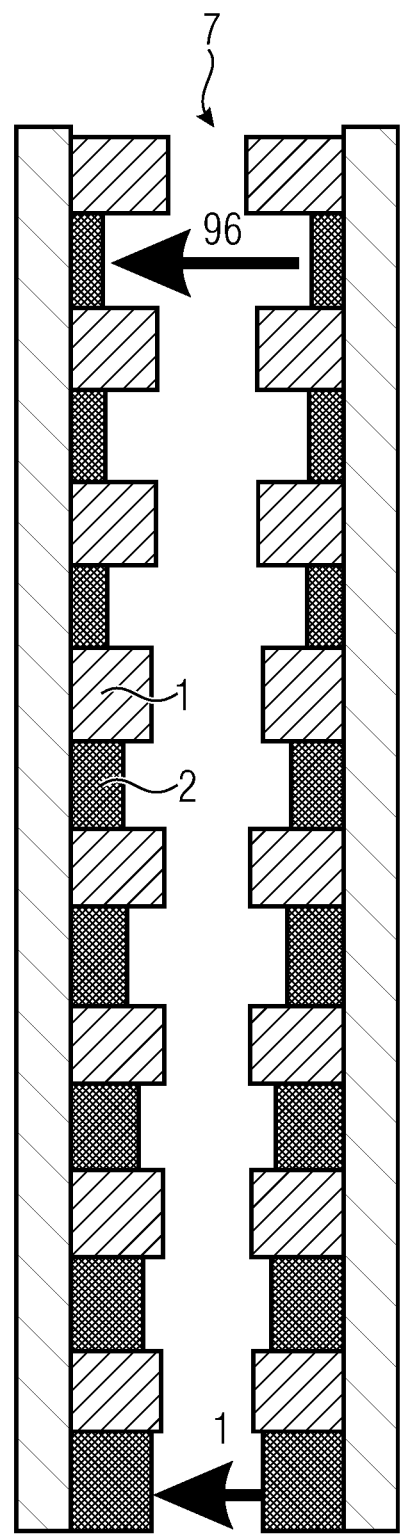
FIG. 1F shows a section of a schematic sectional side view of a vertical recess in a conventional layer stack according to conventional technology for illustrating the problems existing with the previously used methods.

FIG. 1F illustrates this problem. Here, merely schematically, a section of a second vertical recess 7 within a layer stack having several individual layers 1, 2 arranged alternately on top of each other is shown. These are silicon oxide layers 1 and silicon nitride layers 2. The silicon nitride layers 2 are etched away selectively to the silicon oxide layers 1. For this, hot phosphoric acid is used, which expands in vertical direction (in FIG. 1F from top to bottom) within the second vertical recess 7.

As can be seen in FIG. 1F, the individual layers 1, 2 located at the bottom end of the second vertical recess 7 are etched away significantly less in lateral direction than the individual layers 1, 2 located at the top end of the second vertical recess 7. Thus, the used hot phosphoric acid results in inhomogeneous etching rate during selectively etching the silicon nitride layers 10 relative to the silicon oxide layers 1.

This effect also occurs in other wet chemical solutions as well as in other materials of the individual layers 1, 2.

The resulting problem is a limitation of the number of individual layers within the layer stack and the associated limitation of the memory capacity. This means, the second vertical recess 7 cannot be configured in any depth, as otherwise more and more distinct inhomogeneous etching rates occur. Nowadays, up to 96 individual layers can be laterally etched away with this technology. Thus, the number of individual layers within the layer stack is limited to those 96 individual layers. However, this means also that the layer stack may not have significantly more individual layers, which limits, however, the memory capacity of the layer stack accordingly.

The novel method for producing 3D semiconductors described herein allows increasing the etching rate homogeneity during selective removal of individual layers, whereby the number of individual layers within a layer stack can be increased to increase the memory capacity of the semiconductor memory accordingly.

FIGS. 2A to 2H and 2J to 2K show schematically individual method steps of the inventive method according to a first aspect.

Figure 2B:
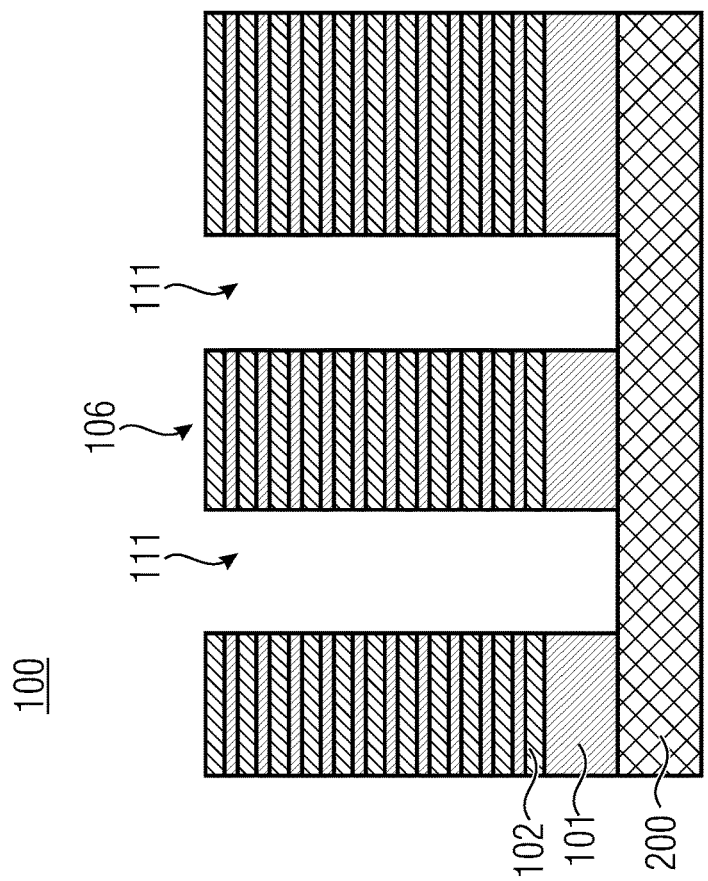
Figure 2A:
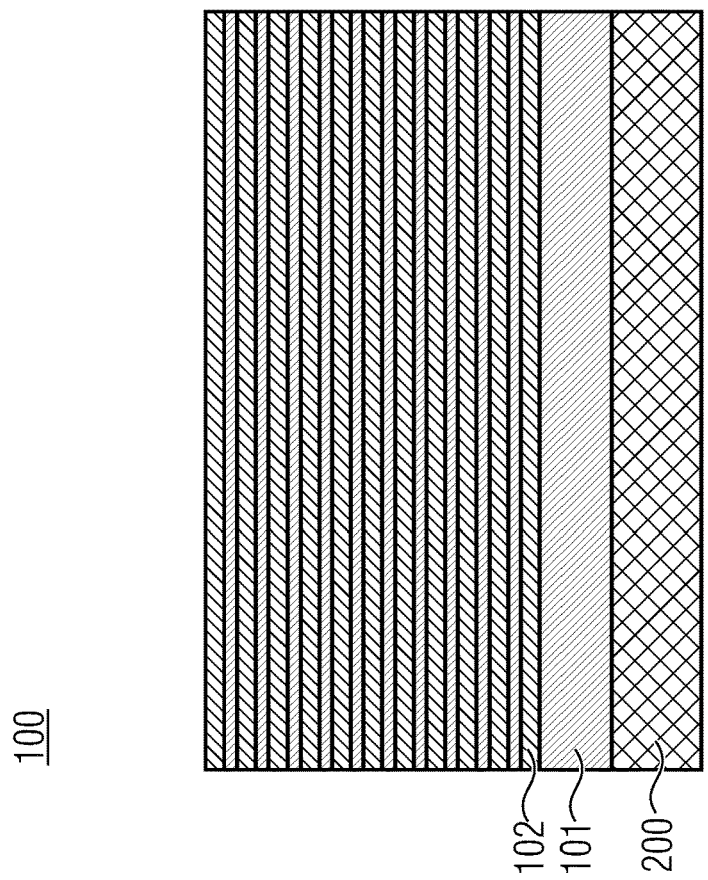

FIG. 2A shows a vertical or three-dimensional layer stack 100. The layer stack 100 is arranged on a substrate 200. On the substrate 200, several individual layers 101 of a first material type as well as several individual layers 102 of a different second material type are arranged alternately. The individual layers 101, 102 can be deposited, for example, on top of each other and can be grown epitaxially, for example.

The individual layers 101 of the first material type can comprise, for example, a first material or can consist thereof. The individual layers 102 of the second material type can comprise, for example, a second material differing from the first material or consist thereof. The first and second materials can have different characteristics.

The material types or the materials of the individual layers 101, 102 can be selected, for example, such that the same have a very high etching selectivity relative to one another. For example, the individual layers 101 of the first material type can comprise a compound semiconductor or can consist of the same. The individual layers 102 of the second material type, however, can comprise an elemental semiconductor or consist of the same. For example, the individual layers 101 of the first material type can comprise an IV-IV compound semiconductor and, in particular, germanium (Ge) or silicon germanium (SiGe) or can consist of germanium or silicon germanium. The individual layers 102 of the second material type, on the other hand, can comprise silicon (Si) or can consist of silicon.

In the example shown in FIG. 2A, an individual layer 101 of the first material type (e.g. SiGe) is arranged on the substrate 200 as bottom or first layer. On this first layer, further individual layers 102 of the second material type as well as further individual layers 101 of the first material type are arranged alternately. This results in a vertical layer stack 100 having several individual layers 101, 102 of the first and the second material type arranged alternately on top of each other. The order of the individual layers 101, 102 can also be exchanged, such that, for example, an individual layer 102 of the second material type is arranged as first layer on the substrate 200.

FIG. 2B shows a further process step. Here, one or several vertical recesses 111 are generated in the layer stack 100. As several vertical recesses can be generated, these vertical recesses 111 are also referred to as first vertical recesses.

These first vertical recesses 111 are structured into the substrate stack 100, advantageously by means of a suitable etching method. The first vertical recesses 111 extend from top to bottom, i.e. starting from a side or surface 106 of the layer stack 100 facing away from the substrate 200 vertically to the bottom in the direction of the substrate 200. Here, the first vertical recesses 111 extend through at least one of the individual layers 101, 102, advantageously through several individual layers 101, 102 and more advantageously, through all individual layers 101, 102 of the layer stack 100 down to the substrate 200.

The first vertical recesses 111 form an access to the respective individual layers 101, 102 of the layer stack 100, in this case to the individual layers 101, 102 of the first and second material type existing in the layer stack 100 at this time. This means the individual layers 101, 102 are exposed portion by portion within the first vertical recesses 111, such that the individual layers 101, 102 are freely accessible via the first vertical recesses 111.

As can be seen in FIG. 2C, one support structure 105 each is generated within the first recesses 111. This support structure 105 is connected to the respective individual layers 101, 102 to mechanically stabilize or support the same.

For generating a support structure 105, at least one of the first vertical recesses 111 can be coated or filled with a layer system, which forms the insulators for the gate and the charge storage of the subsequent NAND memory cell. For coating or filling the first vertical recesses 111, layers are used to generate the insulators and channel region of the NAND memory (gate insulator/memory and channel components). The material used for coating or filling can comprise, for example, one or several components of the group of silicon oxide, silicon nitride and silicon. A possible layer order can be (from inside to outside): silicon oxide-silicon nitride-silicon oxide-silicon. After filling, the respective first vertical recess 111 can be closed by layer depositions. Coating and filling for generating the vertically aligned NAND memory layers can theoretically also take place in another one of the vertical recesses 111, 112, 113 described herein.

FIG. 2D shows a further process step. Here, at least one second vertical recess 112 is structured, e.g. etched, into the layer stack 100. This second vertical recess 112 extends also from top to bottom, i.e. starting from a side 106 of the layer stack 100 facing away from the substrate vertically down in the direction of the substrate 200. The second vertical recess 112 extends additionally through at least one of the individual layers 101, 102, advantageously through several individual layers 101, 102 and more advantageously through all individual layers 101, 102 of the layer stack 100 down to the substrate 200.

The second vertical recess 112 forms an access to the respective individual layers 101, 102 of the layer stack 100, in that case to the individual layers 101, 102 of the first and second material type existing in the layer stack 100 at this time. Therefore, by means of the second vertical recess 112, the respective individual layers 101, 102 of the first and second material type are exposed and made laterally accessible within and along the second vertical recess 112. For example, an etching medium can flow through the vertical recess 112 into the layer stack 100 and reach the individual layers 101, 102 of the first and second material type that have each been made accessible therein.

In this regard, the inventive method includes a step of selectively removing the individual layers 101 of the first material type made accessible by applying a dry etching process directed in lateral direction by means of an etching gas. This is a significant difference of the present invention with respect to the wet chemical etching methods used in conventional technology.

Due to the inventively used dry etching process for selectively removing specific individual layers in the layer stack 100, the wetting problems mentioned in the beginning do not occur as in wet chemical etching methods. Consequently, compared to conventionally used wet etching processes, the individual layers 101 of the first material type can be etched out selectively to the individual layers 102 of the second material type from the layer stack 100 with a significantly increased homogeneity.

With respect to the diffusion transport, a dry etching process can be optimized much better than a wet chemical method. The inventively used dry etching process has significantly more degrees of freedom in process optimization (e.g., greater temperature window, variable process pressure, different process gas flows, . . . ). With these options, selectively etching out the individual layers 101 of the first material layer type can be optimized with respect to the etching rate homogeneity along the second vertical recess 112 in the memory stack 100, despite continuously increasing aspect ratios of the vertical recess 112.

For performing the inventively used dry etching process, the layer stack 100 can be placed into a process chamber. In the same, the layer stack 100 can be etched with specific process parameters and by supplying etching gas into the process chamber in the way described herein. Dry etching can be performed, for example, at high temperatures (approximately 600° C.) with a respective etching gas at low pressure.

For example, the dry etching process can be performed at temperatures of more than 350° C. or at temperatures of more than 500° C. The used etching gas can include, for example, hydrogen chloride (HCl) or can consist of hydrogen chloride. The used etching gas is to be adjusted to the different material types and/or the used materials of the respective individual layers, such that the individual layers of the one material type can be etched out of the layer stack 100 most selectively with respect to the individual layers of the respective different material type. Thus, for example, HCL gas is very well suitable for selectively etching out individual layers 101 of silicon germanium while maintaining individual layers 102 of pure silicon.

For selectively etching out specific individual layers, the etching gas introduced into the process chamber during the dry etching process reaches, through the second vertical recess 112, first, the individual layers 101, 102 of the first and second material type of the layer stack 100 exposed in portions therein. However, the two material types comprise, in combination with the used etching gas, a very high etching selectivity relative to each other. By means of the used etching gas, accordingly, the individual layers of the one material type can be removed very selectively with respect to the individual layers of the respective different material type.

For example, the etching gas can etch out the individual layers 101 of the first material type selectively to the individual layers 102 of the second material type, advantageously in a lateral direction. Lateral direction means a direction running essentially orthogonally to the (vertical) layer direction of the layer stack 100. The layer direction is the direction in which the individual layers 101, 102 are stacked on top of each other, in the present case for example, vertically upwards starting from the substrate 200. In this case, the lateral direction would be, for example, a horizontal direction. Accordingly, the individual layers 101 of the first material type can be etched out of the layer stack 100 in approximately the horizontal direction starting from the second vertical recess 112. The individual layers 102 of the second material type are not substantially attacked by the used etching gas and are hence not etched out, but remain in the layer stack 100.

The etching gas reaching the layer stack 100 through the second vertical recess 112 removes the individual layers on the one material type selectively with respect to the individual layers of the respective other material type. For example, the used etching gas can etch the individual layers 101 of the first material type out of the layer stack 100 in lateral direction. Here, the individual layers 101 of the first material type are etched out selectively to the individual layers 102 of the second material type from the layer stack 100. This means after selectively removing the individual layers 101 of the first material type, merely the individual layers of the second material type 102 remain in the layer stack.

Figure 2F:
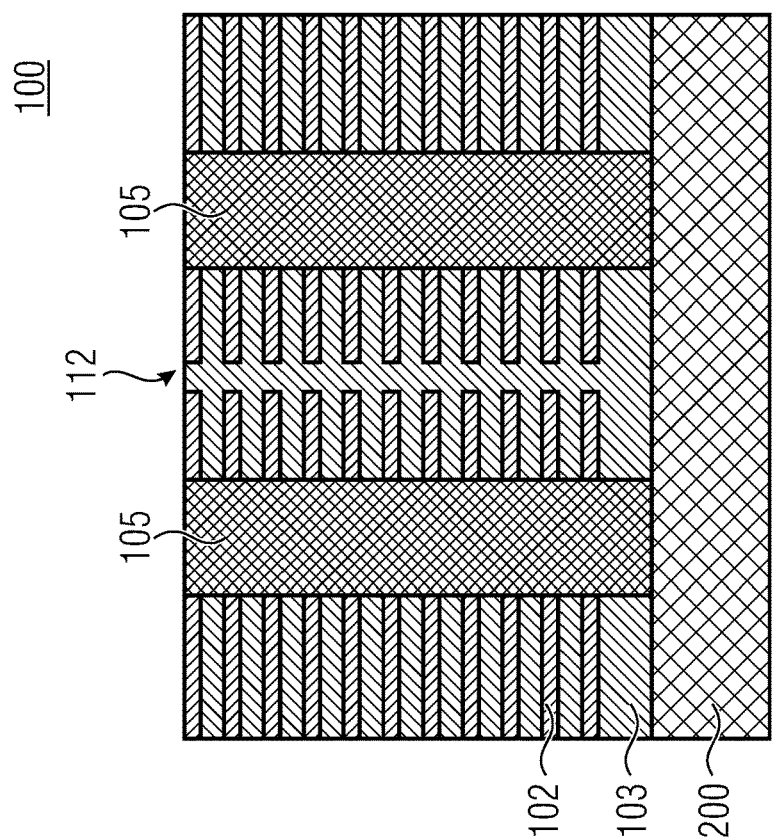
Figure 2E:
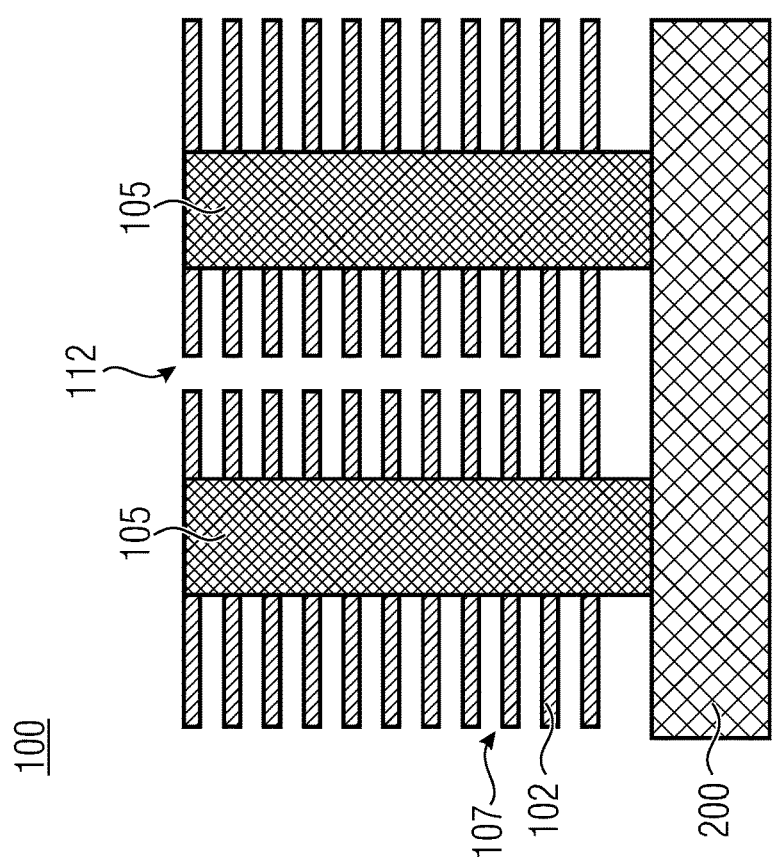

FIG. 2E shows the layer stack 100 formed after selectively etching out the individual layers 101 of the first material type. Merely the individual layers 102 of the second material type remain. Voids 107 are formed between the remaining individual layers 102 of the second material type at the location where the individual layers 101 of the first material type were, which have been removed in the meantime. The remaining individual layers 102 of the second material type are supported on the support structures 105. The support structures 105 are again connected to the substrate 200.

FIG. 2F shows a further process step. Here, individual layers 103 of a third material type are generated. For this, for example, a third material can be introduced in the voids 107 formed between the individual layers 102 of the remaining second material type. Here, individual layers 103 of the third material type are formed within these voids 107 between the remaining individual layers 102. This results in a vertical layer stack 100 comprising individual layers 102 of the second material type and individual layers 103 of a third material type arranged alternately on top of each other.

The individual layers 103 of the third material type can comprise, for example, a third material differing from the first material and/or the second material or can consist of the same. Compared to the first and/or second material, the third material can have different characteristics. For example, the third material can have electrically insulating characteristics. The third material can comprise, for example, silicon (di-) oxid ($SiO_2$) or can consist of silicon (di-)oxid. Accordingly, the individual layers 103 of the third material can have electrically insulating characteristics. The individual layers 102 of the second material type, on the other hand, can have electrically conductive characteristics.

Introducing the third material into the voids 107 between the remaining individual layers 102 of the second material type can be performed, for example, by means of an additive drying process, advantageously from the gas phase. For example, the third material can be introduced into the voids 107 by applying an LPCVD process (LPCVD: low pressure chemical vapor deposition). Here, a process gas can be introduced in the process chamber (where the layer stack 100 is located). Via the second vertical recess 112, the process gas reaches the voids 107 between the individual layers 102 of the second material type and expands therein. Impinging of the gas molecules of the process gas on the individual layers 102 of the second material type has the effect that the third material (e.g., $SiO_2$) grows in the voids 107 between the remaining individual layers 102 of the second material type (e.g., Si). Thereby, the individual layers 103 of the third material type are formed between the individual layers 102 of the second material type.

Figure 2H:
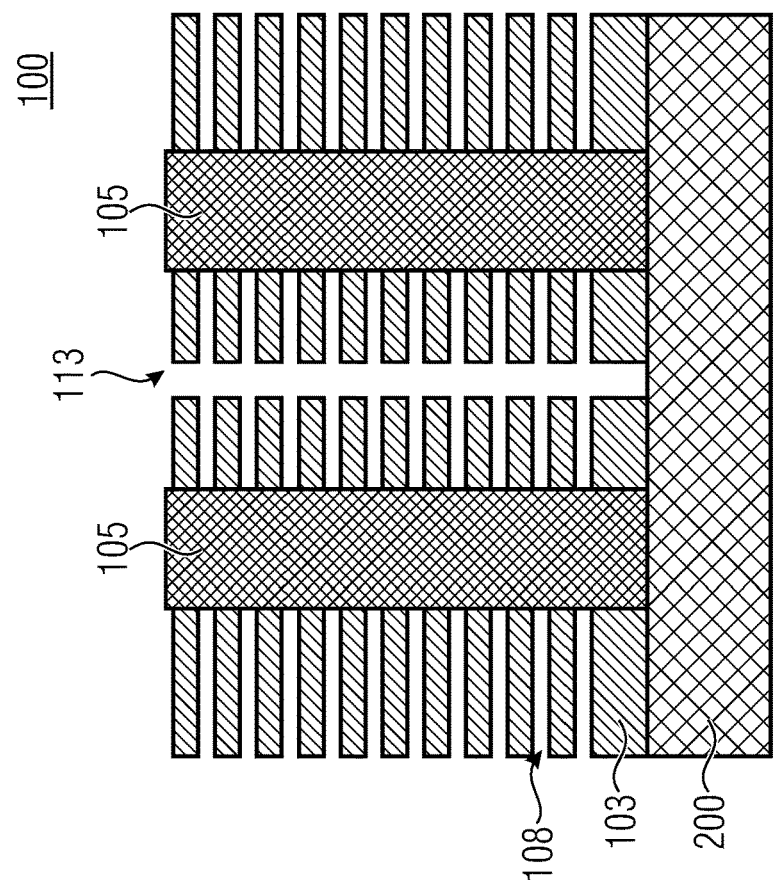
Figure 2G:
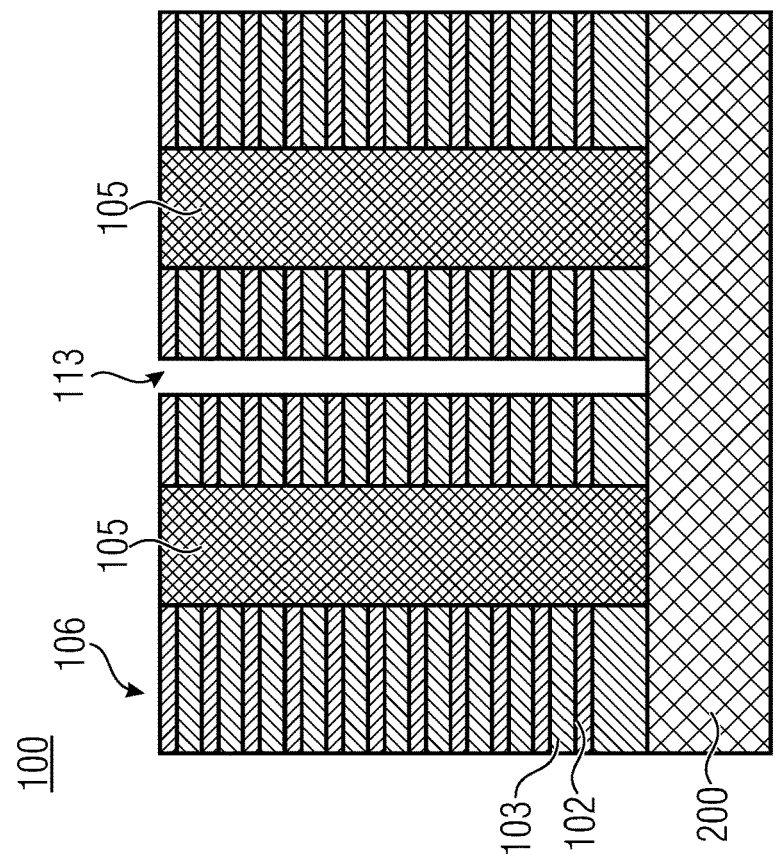

FIG. 2G shows a further process step. Here, at least one third vertical recess 113 is structured into the layer stack 100. Here, for example, the second vertical recess 112 filled with the third material (FIG. 2F) can be exposed again to generate the third vertical recess 113 (FIG. 3G) at the same location. Alternatively, the second vertical recess 112 filled with the third material (FIG. 2F) can remain closed and the third vertical recess 113 can be generated at another location in the layer stack 100. The third vertical recess 113 can be generated between two support structures 105 as shown exemplarily in FIG. 2G.

The third vertical recess 113 extends also from top to bottom, i.e., starting from a side 106 of the layer stack 100 facing away from the substrate 200 vertically downward in the direction of the substrate 200. Additionally, the third vertical recess 113 extends through at least one of the individual layers 102, 103, advantageously through several individual layers 102, 103 and more advantageously, through all individual layers 102, 103 of the layer stack 100 down to the substrate 200.

The third vertical recess 113 forms an access to the respective individual layers 102, 103 of the layer stack 100, in that case to the individual layers 102, 103 of the second and third material type existing in the layer stack 100 at this time. Accordingly, these individual layers 102, 103 of the second and third material type are exposed within the third vertical recess 113 and made accessible via the third vertical recess 113.

Further, the inventive method includes selectively removing the individual layers of the one material type made accessible relative to the individual layers of the respective other material type. In the present case, the method includes selectively removing the individual layers 102 of the second material type selectively to the individual layers 103 of the third material type. This selective removing takes place by applying an etching process directed in lateral direction by means of an etching medium. The etching process can again be a dry etching process, but alternatively also a wet etching process. Accordingly, in this etching step, the etching medium can be an etching gas for dry etching, i.e., an ionized etching gas or plasma like in plasma etching, or a wet chemical etching solution for wet etching.

In the case of a dry etching process, the same can include at least one plasma-supported etching step with a fluorine-containing gas. Dry etching can be performed, for example, as isotropic CDE process (CDE: Chemical Dry Etching) with a fluorine-containing gas, wherein, for example, silicon (as possible material of the individual layers 102) can be etched very selectively to $SiO_2$ (as possible material of the individual layers 103). $SF_6$ can be used as etching gas, for example. In particular, plasma-etchings with a very high $SF_6$ flow, a low $O_2$ flow and a high process pressure allow very selective etchings between Si and $SiO_2$ with an isotropic etching behavior as desired for this etching.

Through the third vertical recess 113, the etching medium (e.g., $SF_6$ gas) reaches the individual layers 102, 103 of the second and third material type exposed and made accessible within the third vertical recess 113. Here, the etching medium removes the individual layers 102 of the second material type in lateral direction selectively to the individual layers 103 of the third material type, such that after selectively removing the individual layers 102 of the second material type merely the individual layers 103 of the third material type remain. This means the individual layers 102 of the second material type are etched out of the layer stack 100.

FIG. 2H shows a layer stack 100 formed after selectively etching out the individual layers 102 of the second material type. Here, merely the individual layers 103 of the third material type remain. Voids 108 are formed between the remaining individual layers 103 of the third material type where the individual layers 102 of the second material type were, which have been removed in the meantime. The remaining individual layers 103 of the third material type are supported on the support structures 105.

Figure 2J:
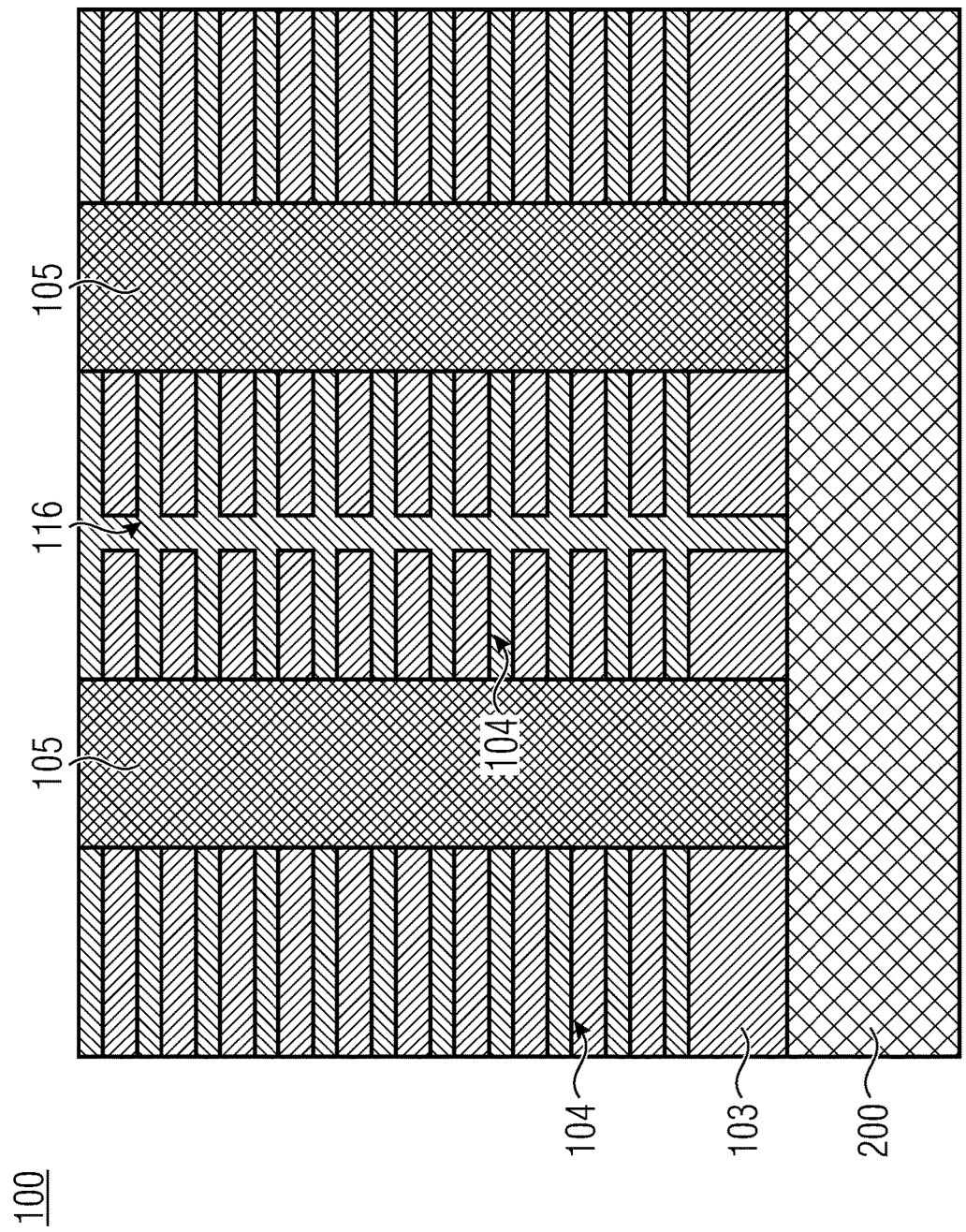

FIG. 2J shows an optional further process step. A fourth material can be introduced into the voids 108 formed between the individual layers 103 of the remaining third material type. Here, individual layers 104 of the fourth material type are formed within these voids 108 between the remaining individual layers 103 of the third material type. Thereby, a vertical layer stack 100 is formed with individual layers 103 of the third material type and individual layers 104 of the fourth material type alternately arranged on top of each other.

The fourth material can differ from the third material. The fourth material can be an electrically conductive metal and in particular highly conductive metal or can consist of the same. For example, the fourth material can comprise at least one component of the group of tungsten, cobalt, molybdenum or ruthenium or can consist of this component.

Alternatively, the fourth material can comprise a doped semiconductor or can consist of the same. The fourth material can comprise, for example, doped silicon.

Due to the above-described filling of the vertical recess 113 (FIG. 2H) with the fourth material, a vertically oriented structure 116 is formed at this location, which is connected both mechanically and electrically to the respective individual layers 103, 104.

As shown in FIG. 2K, this vertical structure 116 can be removed, e.g., by means of a suitable etching process, such that the individual layers 103, 104 (and in particular, the electrically conductive individual layers 104 of the fourth material type) are no longer connected mechanically or electrically. This means a fourth vertical recess 114 can be generated in the layer stack 100, for example, between the support structures 105. This fourth vertical recess 114 can interrupt the electrical connection (when viewed in lateral or horizontal direction) between the previously connected individual layers 103 of the third material type as well as between the previously connected individual layers 104 of the fourth material type.

Thus, the individual layers 104 of the fourth material type can each form a word line of the generated three-dimensionally integrated semiconductor memory 1000.

FIGS. 3A to 3D shown an alterative solution for the above-described method steps for producing a three-dimensionally integrated semiconductor memory. This means the method described below is an alternative solution for the same objective technical object.

In this alternative solution, the method steps described above with reference to FIGS. 2A to 2E are the same. Thus, all above statements apply accordingly for this alternative solution.

FIG. 3A shows again the initial situation of the layer stack 100 as it is also shown in FIG. 2E and is formed up to this method step. Here, the layer stack 100 existing at this time comprises only the individual layers 102 of the second material type. Voids 107 are formed between these individual layers 102 of the second material type.

The individual layers 102 of the second material type are supported on the support structures 105 and the second vertical recess 112 is located between the support structures 105. While in the embodiment described above with reference to FIGS. 2F to 2K a third material has been introduced into the voids 107 to generate the individual layers 103 of the third material type, in this alternative embodiment, instead, the individual layers 103 of the third material type are generated from the individual layers 102 of the second material type.

As can be seen, in FIG. 3B, the individual layers 103 of the third material type are generated at the locations in the layer stack 100 where the individual layers 102 of the second material type were located before. Accordingly, the voids 107 are also maintained at their previous locations that are hence between the newly formed individual layers 103 of the third material type.

Generating the individual layers 103 of the third material type from the individual layers 102 of the second material type can be performed, for example, by means of oxidation. Here, for example, the individual layers 102 of the second material type can be oxidized at least partly, such that the individual layers 102 of the second material type change their characteristics, i.e., their material type, due to the grown oxides. Thereby, the individual layers 103 of the third material type are generated from the individual layers 102 of the second material type. In other words, the individual layers 103 of the third material type can be generated by converting the individual layers 102 of the second material type and thereby changing their material type. Thus, accordingly, the individual layers 103 of the third material type are now located at those locations in the layer stack 100 where the individual layers 102 of the second material type were located before. Additionally, an oxide layer can be attached to the substrate 200 during oxidation.

For example, the individual layers 102 of the second material type can comprise silicon or can consist of silicon. These individual layers can then be converted to silicon (di)oxide $SiO_2$ by means of thermal oxidation, such that the generated individual layers 103 of the third material type comprise silicon (di)oxide.

Instead of thermal oxidation of silicon to silicon oxide, a further embodiment (not explicitly illustrated herein) provides that the individual layers 102 of the second material type are coated with a coating material, e.g., by applying a coating method. The individual layers 102 of the second material type can be, for example, completely and entirely coated with a coating material and in that way be enclosed by the coating material. The coating material can have characteristics that differ from the characteristics of the second material type. For example, the coating material can have a third material type that differs from the second material type.

Thereby, obviously, the characteristics of the individual layers 102 of the second material type coated with exactly that coating material change as well, i.e., the material type of individual layers 102 changes. Thus, the individual layers 103 of the third material type can be generated from the individual layers 102 of the second material type by coating the individual layers 102 of the second material type with a coating material having a third material type differing from the second material type. Or, in other words, the individual layers 103 of the third material type are the individual layers 102 of the second material type coated with the coating material, wherein the coating material defines the third material type. Thus, the individual layers 103 of the third material type are located at the locations in the layer stack 100 where the non-coated individual layers 102 of the second material type were located before.

For example, the individual layers 102 of the second material type can have a material type with electrically semiconductive characteristics. The coating material used for coating the individual layers 102 can have, on the other hand, a material type with electrically insulating characteristics. For example, the coating material can be an oxide or a nitride. The same is attached to the electrically conductive individual layers 102 of the second material type, such that, after coating with the electrically insulating material, individual layers 102 accordingly have electrically insulating characteristics and hence form the individual layers 103 of the third material type. Thus, in this example, the material type changes from electrically semiconductive (second material type) to electrically insulating (third material type).

As a result, a layer stack 100 is obtained as described above with reference to FIG. 2H. Accordingly, all features discussed with reference to FIG. 2H apply accordingly for the method step as illustrated in FIG. 3B.

However, it can be seen that two process steps, namely the process steps shown in FIG. 2F and FIG. 2J can be completely omitted. This is an advantage of this alternative embodiment.

FIG. 3C shows a further process step. This step corresponds essentially to the method step described above with reference to FIG. 2J. Here, accordingly, all features of FIG. 2J apply accordingly for FIG. 3C.

Here, the voids that existed between the individual layers 103 of the third material (FIG. 3B) are filled with a fourth material. Here, within these voids 107 between the individual layers 103 of the third material type, individual layers 104 of a fourth material type are formed. Thereby, a vertical layer stack 100 is formed, which comprises individual layers 103 of the third material type and individual layers 104 of the fourth material type alternately arranged on top of each other.

The fourth material can differ from the third material (coating material). The fourth material can comprise an electrically conductive metal and in particularly a highly conductive metal or consist thereof. For example, the fourth material can comprise at least one component of the group of tungsten, cobalt, molybdenum or ruthenium or can consist of that component.

Alternatively, the fourth material can comprise a doped semiconductor or can consist of the same. For example, the fourth material can comprise doped silicon.

Accordingly, the individual layers 104 of the fourth material type can have electrically conductive characteristics. As mentioned above, the individual layers 103 of the third material type can comprise, for example, electrically insulating characteristics. Thus, the third and fourth material type can have different characteristics.

FIG. 3D shows a further process step essentially corresponding to the process step discussed above with reference to FIG. 2K. Here, accordingly, all features of FIG. 2K also apply to FIG. 3D. Here also, a fourth vertical recess 114 can be structured into the layer stack 100, for example between the support structures 105. This fourth vertical recess 114 can be structured into the layer stack 100, for example by means of a suitable etching process, such that the individual layers 103, 104 (and in particular the electrically conductive individual layers 104 of the fourth material type) are no longer connected to each other mechanically or electrically, as described above with reference to FIG. 2K.

Thus, the individual layers 104 of the fourth material type can each form a word line of the of the generated three-dimensionally integrated semiconductor memory 1000.

At the end of the above-described process steps of both methods, a three-dimensionally integrated semiconductor memory 1000 is formed. This can be, in particular a 3D NAND flash memory.

The Gate NAND structure can be integrated in one of the support structures 105 or after filling the layer stack with the fourth material (e.g. tungsten) by generating a further vertical recess in the layer stack 100 and coating this further vertical recess with respective layers.

For the inventive method described herein, it has shown to be particularly advantageous when the individual layers 101 of the first material type comprise germanium (Ge) or silicon germanium (SiGe) or consist thereof. Ge or SiGe can be etched very precisely by means of dry etching methods, in particularly by applying HCl gas, and it additionally has a very high selectivity with respect to e.g. silicon (as material of the individual layers 102).

However, it is also possible that the individual layers 101 of the first material type comprise other materials instead of germanium or silicon germanium or consist of other materials. Here, it is decisive that the first material type has a high etching selectivity with respect to the second material type. This can be obtained, for example, by the fact that the first material (used for the individual layers 101 of the first material type) has a high selectively with respect to the second material (used for the individual layers 102 of the second material type) and that can be etched out of the layer stack 100 selectively to that second material by means of a suitable gas by applying a dry etching process.

In summary, the present invention describes a method that allows generating a layer stack 100, including, for example, conductive material layers between insulator layers, exclusively with the help of dry etching processes.

In other words, a method for producing a layer stack 100 in a semiconductor memory 1000 is provided. The method comprises providing a substrate 200 as well as a step of depositing at least one first layer 101 on the substrate 200, wherein this layer 101 can essentially consist of silicon and germanium. Further, the method includes a step of depositing at least one second layer 102 on the first layer 101, wherein the second layer 102 can essentially comprise silicon. Additionally, the method includes a step of producing a first vertical recess 111 in the layer stack 100 comprising at least the first and second layers 101, 102, wherein the first vertical recess 111 can be produced by means of dry etching and can reach down to a surface of the substrate 200. Further, the method includes a step of structuring at least one support element 105 in the first vertical recess 111, wherein the support element 105 can extend vertically from a surface of one of the first and second layers 101, 102, to a surface of the substrate 200. Additionally, the method includes producing a second vertical recess 112 in the layer stack 100 comprising at least the first and second layers 101, 102. The second vertical recess 112 can be produced by means of dry etching and can reach down to a surface of the substrate 200. A further step includes removing the first layer 101 (e.g. comprising silicon and/or germanium). According to the invention, a dry etching process is used. Further, the method includes filling the layer stack 100 with an insulator material 103, such as $SiO_2$. A further step of the method includes producing a third vertical recess 113 in the insulator material 103, wherein this third vertical recess 113 can reach down to a surface of the substrate 200 such that the second layer 102 (e.g. silicon) is laterally exposed. Further, the method includes removing the second layer 102 (e.g. Si).

Further, the invention relates to a layer stack 100 in a semiconductor memory 1000 that can be produced by means of this method. The semiconductor memory 1000 can be, for example, a 3D NAND flash memory chip or a 3D NAND memory cell.

Further, the invention relates to a method for producing a three-dimensionally integrated semiconductor memory 1000, wherein the method comprises a step of providing a substrate 200 as well as generating a layer stack 100 having several individual layers 101, 102 on the substrate 200, while alternately depositing several individual layers 101 of a first material type as well as several individual layers 102 of a different second material type. Additionally, the method includes a step of structuring at least one first vertical recess 111 in the layer stack 100 and generating a support structure 105 within the first vertical recess 111, wherein the support structure 105 is connected to the respective individual layers 101, 102 and mechanically stabilizes the same. Further, the method includes structuring at least one second vertical recess 112 in the layer stack 100, wherein the second vertical recess 112 provides access to the respective individual layers 101, 102 of the layer stack 100. Above that, the method includes selectively removing the individual layers 101 of the first material type that have been made accessible by applying an etching process directed in lateral direction by means of an etching gas that reaches the layer stack 100 through the second vertical recess 112 and reaches the individual layers 101 of the first material type made accessible therein and removes the same in lateral direction selectively to individual layers 102 of the second material type, such that after selectively removing the individual layers 101 of the first material type the individual layers 102 of the second material type remain in the layer stack 100 and voids 107 are formed between the remaining individual layers 102 of the second material type. According to the invention, the method is characterized in that the individual layers 101 of the first material type comprise silicon germanium or consist of silicon germanium and the etching process directed in lateral direction for selectively removing the individual layers 101 of the first material type is performed in the form of a dry etching process by using an etching gas.

The inventive method described herein according to the first embodiment (FIGS. 2A to 2H and 2J to 2K) can comprise a step of structuring a third vertical recess 113 in the layer stack 100. According to the invention, this step can include that the second vertical recess 112 filled with the third material is exposed again to generate the third vertical recess 113 at the same location or that the second vertical recess 112 filled with the third material remains closed and the third vertical recess 113 is generated at a different location in the layer stack 100.

According to the inventive method described herein, the step of generating the first and/or second and/or third and/or fourth vertical recess 111, 112, 113, 114 can include that the respective vertical recess 111, 112, 113, 114 is generated such that the same extends completely through the layer stack 100 down to the substrate 200.

According to the inventive method described herein, the first vertical recess 111 can be at least partly filled with a material that is solidified and forms a support structure 105 within the first vertical recess 111, wherein, after selectively removing the individual layers 101 of the first material type, this support structure 105 serves to mechanically support the remaining individual layers 102 of the second material type and to keep them spaced apart, and, after generating the individual layers 103 of the third material type, to mechanically support the same and to keep them spaced apart.

Both embodiments of the inventive method described herein serve to produce or generate a three-dimensionally integrated semiconductor memory 1000. This can be, for example, a 3D NAND memory.

According to the inventive method described herein, the individual layers 104 of the fourth material type can each form a word line of the generated three-dimensionally integrated semiconductor memory 1000.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for producing a three-dimensionally integrated semiconductor memory, the method comprising:
   providing a substrate,
   generating a layer stack comprising several individual layers on the substrate by alternately depositing several individual layers of a first material type as well as several individual layers of a different second material type,
   structuring at least one first vertical recess in the layer stack and generating a support structure within the first vertical recess, wherein the support structure is connected to the respective individual layers and mechanically stabilizes the same, structuring at least one second vertical recess in the layer stack, wherein the second vertical recess provides access to the respective individual layers of the layer stack, selectively removing the individual layers of the first material type that have been made accessible by applying an etching process directed in lateral direction by means of an etching gas reaching into the layer stack through the second vertical recess and reaching the individual layers of the first material type that have been made accessible therein and removing the same in lateral direction selectively to the individual layers of the second material type, such that after selectively removing the individual layers of the first material type the individual layers of the second material type remain in the layer stack and voids are formed between the remaining individual layers of the second material type, generating individual layers of a third material type by means of introducing a third material into the voids formed in that way, such that individual layers of a third material type are each formed within the voids between the remaining individual layers of the second material type, structuring at least a third vertical recess in the layer stack, wherein the third vertical recess provides access to the respective individual layers of the layer stack, selectively removing the individual layers of the second material type that have been made accessible by applying an etching process directed in lateral direction by means of an etching medium reaching into the layer stack through the third vertical recess and reaching the individual layers of the second material type made accessible therein and selectively removing the same in lateral direction, such that after selectively removing the individual layers of the third material type remain and voids are formed between these remaining individual layers of the third material type, wherein the individual layers of the first material type comprise silicon germanium or consist of silicon germanium and the etching process directed in lateral direction for selectively removing the individual layers of the first material type is performed in the form of a dry etching process by using an etching gas.

2. The method according to claim 1,
wherein selectively removing the individual layers of the second material type while maintaining the individual layers of the third material type is performed by applying a dry etching process comprising at least a plasma-supported etching step with fluorine-containing gases.

3. The method according to claim 1,
wherein introducing the third material into the voids between the remaining individual layers of the second material type comprises a process gas reaching these voids via the second vertical recess and expanding therein and the third material is grown between the remaining individual layers of the second material type.

4. The method according to claim 3,
wherein introducing the third material is performed by applying an LPCVD method.

5. The method according to claim 1,
wherein the individual layers of the second material type comprise silicon or consist of silicon.

6. The method according to claim 1,
wherein the individual layers of the third material type comprise electrically insulating characteristics and/or
wherein the individual layers of the third material type comprise silicon (di) oxide or consist of silicon (di) oxide.

7. The method according to claim 1,
wherein the dry etching process for selectively removing the individual layers of the first material type is performed at temperatures of more than 350° C. and wherein the etching gas comprises hydrogen chloride or consists of hydrogen chloride.

8. The method according to claim 1,
wherein after generating the individual layers of the third material type the voids formed between the same are filled with a fourth material, such that individual layers of a fourth material type are each formed between the individual layers of the third material type, wherein the fourth material type differs from the third material type and is electrically conductive.

9. The method according to claim 8,
wherein the individual layers of the fourth material type comprise an electrically conducting metal, in particular at least one component of the group of tungsten, cobalt, molybdenum or ruthenium or consist thereof, or
wherein the individual layers of the fourth material type comprise a doped semiconductor, in particular doped silicon or consist thereof.

10. A three-dimensionally integrated semiconductor memory that can be produced by a method according to claim 1.

* * * * *